(12) United States Patent
Liu et al.

(10) Patent No.: US 8,642,989 B2
(45) Date of Patent: Feb. 4, 2014

(54) RESISTIVE RANDOM ACCESS MEMORY CELL AND MEMORY

(75) Inventors: Qi Liu, Beijing (CN); Ming Liu, Beijing (CN); Shibing Long, Beijing (CN); Hangbing Lv, Beijing (CN)

(73) Assignee: Institute of Microeletronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/512,797

(22) PCT Filed: Oct. 13, 2011

(86) PCT No.: PCT/CN2011/080728
§ 371 (c)(1),
(2), (4) Date: May 30, 2012

(87) PCT Pub. No.: WO2012/100562
PCT Pub. Date: Aug. 2, 2012

(65) Prior Publication Data
US 2013/0119341 A1      May 16, 2013

(30) Foreign Application Priority Data

Jan. 27, 2011   (CN) .......................... 2011 1 0029781

(51) Int. Cl.
*H01L 45/00*          (2006.01)

(52) U.S. Cl.
USPC .......................................................... 257/4

(58) Field of Classification Search
USPC .......................................................... 257/4
See application file for complete search history.

(56) References Cited

U.S. PATENT DOCUMENTS

2011/0089391 A1    4/2011   Mihnea et al.

FOREIGN PATENT DOCUMENTS

| CN | 101315942 A | 12/2008 |
| CN | 101667460 A | 3/2010 |
| CN | 101779287 A | 7/2010 |

OTHER PUBLICATIONS

Chinese International Search Report for PCT/CN2011/080728, dated Jan. 19, 2012.

*Primary Examiner* — Whitney T Moore
(74) *Attorney, Agent, or Firm* — Kinney & Lange, P.A.

(57) ABSTRACT

A Resistive Random Access Memory (RRAM) cell and a memory are disclosed. In one embodiment, the RRAM cell comprises a two-state resistor and a resistive switching memory cell connected in series. The two-state resistor can supply relatively large currents under both positive and negative voltage polarities. As a result, it is possible to reduce leakage paths in a crossbar array of memory cells, and thus to suppress reading crosstalk.

15 Claims, 4 Drawing Sheets

RESISTIVE RANDOM ACCESS MEMORY CELL AND MEMORY

TECHNICAL FIELD

The present disclosure relates to the microelectronics field, especially, the memory technology. More particularly, the present disclosure relates to a resistive random access memory cell suitable for integration with a crossbar array architecture and also to a memory.

BACKGROUND

As an emerging nonvolatile memory technology, Resistive Random Access Memories (RRAMs) present various advantages in terms of cell area, device density, power consumption, programming/erasing speed, three-dimensional integration, multi-value implementation, and the like over FLASH memories, and thus attract attentions from the industry and research institutes. With the continuous development of the RRAM technology, the RRAMs have become a most promising candidate for leading products in the future memory market.

The RRAMs comprise a vertical arrangement of Metal/Insulator/Metal (MIM). As a result, the RRAMs can achieve high-density storage by means of a crossbar array configuration. In the crossbar array configuration, memory cells are disposed at respective intersections between a set of parallel lines and a further set of parallel lines, which are vertically spaced apart and extend in directions perpendicular to each other. Each of the memory cells can achieve independent selecting and thus reading/writing thereof.

Figure 1:
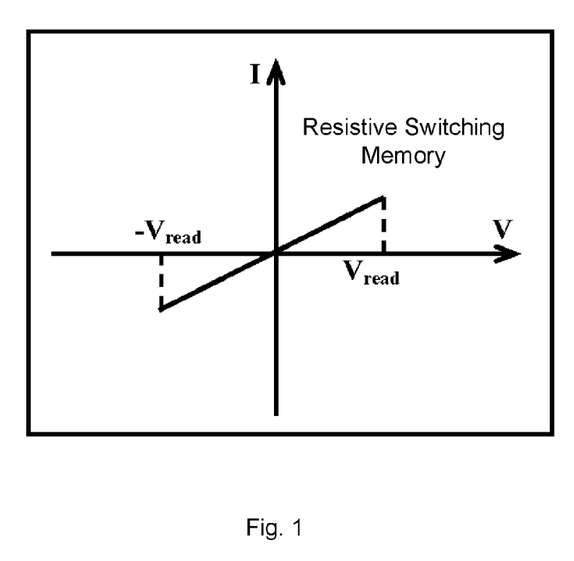
FIG. 1 is a schematic plot showing a current versus voltage (I-V) characteristic presented by an existing Resistive Random Access Memory (RRAM) cell in a low-resistance state during a read operation.
Figure 2:
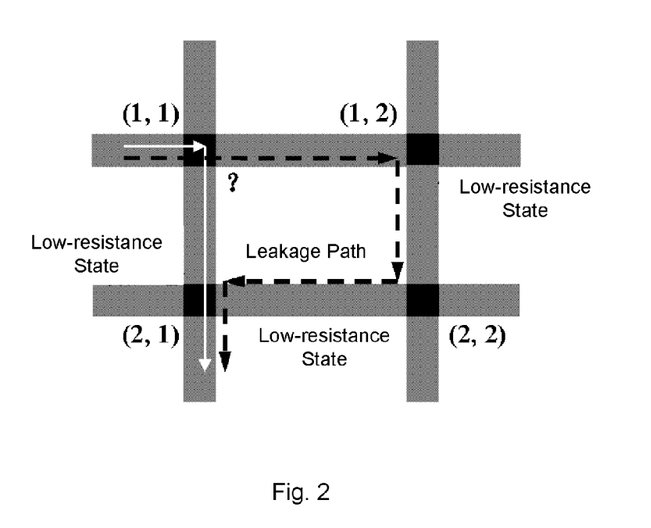
FIG. 2 is a schematic view illustrating reading crosstalk in an existing RRAM crossbar array.

FIG. 1 is a schematic plot showing a current versus voltage (I-V) characteristic presented by an existing RRAM cell in a low-resistance state during a read operation. As shown in FIG. 1, when the RRAM cell is in the low-resistance state, the device, being subjected to a DC sweep from $-V_{read}$ to $V_{read}$, exhibits the symmetric I-V characteristic under positive and negative voltage polarities. In a crossbar array, some of the memory cells which are in the low-resistance state will create additional leakage paths due to their symmetric reading characteristic. These leakage paths will impact reading of the memory cells, resulting in severe reading crosstalk in the memory array. FIG. 2 is a schematic view illustrating the reading crosstalk in an existing RRAM crossbar array. As shown in FIG. 2, among four adjacent memory cells, one cell with a coordinate of (1,1) is in the high-resistance state, while the remaining three cells (1,2), (2,2), and (2,1) are in the low-resistance state. In a case where a read voltage is applied to the cell (1,1), it is expected that a current would flow along a path of (1,1)→(2,1), as indicated by white arrows in the drawing. Instead, actually a current can flow along a low-resistance path of (1,2)→(2,2)→(2,1), as indicated by black dotted arrows in the drawing. As a result, the cell (1,1) is misread as being in the low-resistance state (an ON state). In FIG. 2, a symbol "?" indicates that the true state of the cell (1,1) cannot be accurately acquired in this case.

For unipolar and bipolar RRAMs, currents flowing through a device in the low-resistance state under a positive read voltage and a negative read voltage should have different values, in order to suppress the crosstalk. This implies that the memory cell should exhibit a rectifying characteristic. The unipolar RRAMs have a programming voltage and an erasing voltage which are same in polarity, and thus can achieve suppression of the crosstalk simply with a normal rectifying diode. However, the bipolar RRAMs have a programming voltage and an erasing voltage which must be different in polarity, and thus need relatively large currents in both a positive direction and a negative direction under relatively large (programming or erasing) voltages. Normal unidirectional rectifying diodes cannot supply a sufficient current for the erasing operation at all.

Presently, most of the bipolar RRAMs adopt transistors as selector devices, and thus have their memory cells in a 1T1R configuration so as to suppress the reading crosstalk in the array. However, a memory cell in the 1T1R configuration has a cell area larger than that of a memory cell in a 1D1R or 1R configuration. As a result, it is disadvantageous in improving the storage density.

SUMMARY

Problems to be Solved

To address the above disadvantages, there are provided a Resistive Random Access Memory (RRAM) cell suitable for integration with a crossbar array architecture, by which it is possible to suppress the reading crosstalk and thus to improve the storage density.

Solutions

According to an aspect of the present disclosure, there is provided a Resistive Random Access Memory (RRAM) cell. The RRAM cell may comprise a two-state resistor and a resistive switching memory cell connected in series. The two-state resistor may comprise a lower conductive electrode, a two-state resistor functionality layer, and a middle conductive electrode. The two-state resistor functionality layer may comprise an n-p-n junction or a p-n-p junction consisted of any one or more of doped Si, Ge, GaAs, InP, and SiGe.

According to an embodiment, in the two-state resistor functionality layer, the n-p-n junction or the p-n-p junction may have a doping concentration of about $1\times10^{12}$ cm$^{-2}$-about $1\times10^{22}$ cm$^{-2}$.

According to an embodiment, the n-p-n junction may comprise an n-p-n Si nanowire.

According to an embodiment, the two-state resistor functionality layer may have a thickness of about 10 nm-about 500 nm, may be doped by means of thermal diffusion or ion implantation, and may be deposited by means of Chemical Vapor Deposition, Atom Layer Deposition, or Molecule Beam Epitaxy.

According to an embodiment, the two-state resistor comes into a low-resistance state from a high-resistance state when a forward sweeping voltage reaches a forward ON voltage $V_1$, and keeps this low-resistance state in a forward direction. When the sweeping voltage is swept back from $V_1$, the two-state resistor keeps the low-resistance state until the sweeping voltage becomes lower than $V_2$, at which point the two-state resistor comes back to the high-resistance state from the low-resistance state, wherein $V_1 > V_2$. The two-state resistor comes into the low-resistance state from the high-resistance state when a reverse sweeping voltage reaches a reverse ON voltage $V_3$, and keeps the low-resistance state in a reverse direction. When the sweeping voltage is swept back from $V_3$, the two-state resistor keeps the low-resistance state until the sweeping voltage becomes smaller than $V_4$, at which point the two-state resistor comes back to the high-resistance state from the low-resistance state, wherein $|V_3| > |V_4|$.

According to an embodiment, the resistive switching memory cell may comprise a bipolar resistive switching memory cell, and may have: a programming voltage $V_{program}$ satisfying $V_{program} > V_{set} > V_1$; an erasing voltage $V_{erase}$ satisfying $|V_{erase}|>V_3$; and a read voltage $V_{read}$ satisfying $V_1<V_{read}<V_{set}$ and $|V_{read}|<|V_3|$. Here, $V_{set}$ is a threshold at which the bipolar resistive switching memory cell transits from a high-resistance state to a low-resistance state.

According to an embodiment, the resistive switching memory cell may comprise an unipolar resistive switching memory cell, and may have: a programming voltage $V_{program}$ satisfying $V_{program}>V_{set}$; an erasing voltage $V_{erase}$ satisfying $V_1<V_{reset}<V_{erase}<V_{set}$; and a read voltage $V_{read}$ satisfying $V_1<V_{read}<V_{reset}$ and $|V_{read}|<|V_3|$. Here, $V_{set}$ is a threshold at which the unipolar resistive switching memory cell transits from a high-resistance state to a low-resistance state, and $V_{reset}$ is a threshold at which the unipolar resistive switching memory cell transits from the low-resistance state to the high-resistance state.

According to an embodiment, the resistive switching memory cell may comprise the middle conductive electrode, a resistive storage layer, and an upper conductive electrode. The two-state resistor and the resistive switching memory cell can share the middle conductive electrode.

According to an embodiment, the resistive storage layer has a thickness of about 5 nm-about 500 nm, is deposited by means of any one of Electron Beam Evaporation, Chemical Vapor Deposition, Pulsed Laser Deposition, Atom Layer Deposition, Spin Coating, and Magnetron Sputtering, and comprises any one or more of CuS, AgS, AgGeSe, $CuI_xS_{1-x}$ where $0.1<x<1$, $ZrO_2$, $HfO_2$, $TiO_2$, $SiO_2$, $WO_x$ where $1<x<3$, NiO, $CuO_x$ where $0.5<x<1$, ZnO, TaO, where $1<x<2.5$, CoO, $Y_2O_3$, Si, PrCaMnO, $SrZrO_3$, $SrTiO_3$, Cu-tetracy anoquinodimethane (Cu-TCNQ), aluminium tris(quinolin-8-olate) ($AlQ_3$), and poly(3,4-ethylenedioxythiophene) (PEDOT), with or without being doped.

According to an embodiment, each of the upper, middle and lower conductive electrodes may have a thickness of about 1 nm-500 nm, may be deposited by means of any one of Electron Beam Evaporation, Chemical Vapor Deposition, Pulsed Laser Deposition, Atom Layer Deposition, and Magnetron Sputtering, and may comprise any one or more of W, Al, Cu, Au, Ag, Pt, Ru, Ti, Ta, Pb, Co, Mo, Ir, Ni, TiN, TaN, $IrO_2$, ITO, and IZO.

According to a further aspect of the present disclosure, there is provided a Resistive Random Access Memory (RRAM). The RRAM may comprise a resistance read/write unit, an addressing unit, and a plurality of above described RRAM cells. The addressing unit may be connected to the plurality of RRAM cells, and may be configured to address a RRAM cell to be operated, wherein operation on the RRAM cell comprises setting, resetting, and programming. The resistance read/write unit may be connected to the addressing unit and to the plurality of RRAM cells, and may be configured to operate the addressed RRAM cell.

Advantageous Effects

According to embodiments of the present disclosure, a RRAM cell comprises a resistive switching memory cell and a two-state resistor connected in series. The two-state resistor can assume a high-resistance state and a low-resistance state under both positive and negative voltage polarities, that is, exhibits a bidirectional rectifying characteristic. Therefore, the two-state resistor can supply relatively large operation currents under relatively large voltages in both a forward direction and a reverse direction, and thus can serve as a selector device to be connected in series with a unipolar or bipolar resistive switching memory cell. As a result, it is possible to reduce leakage paths in a crossbar array of memory cells and suppress reading crosstalk.

DETAILED DESCRIPTION

Objects, solutions, and advantages of the present disclosure will become more apparent from the following detailed descriptions in conjunction with embodiments with reference to attached drawings.

Figure 3:
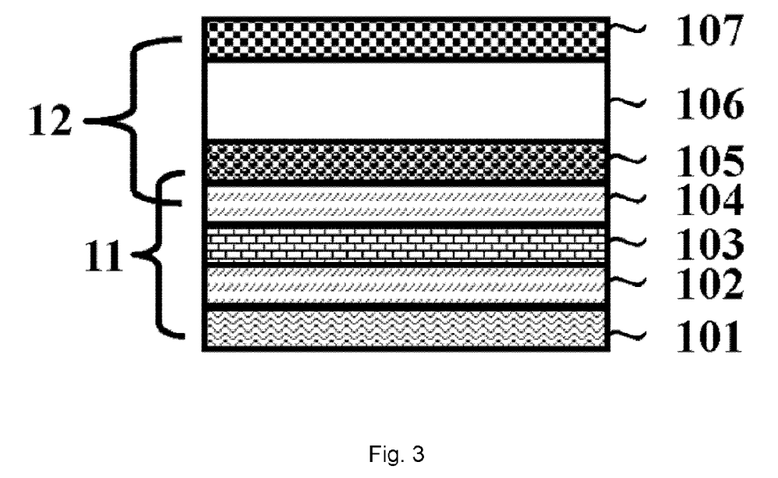
FIG. 3 is a structural view schematically showing a RRAM cell according to an embodiment of the present disclosure.

According to an embodiment of the present disclosure, there is provided a Resistive Random Access Memory (RRAM) cell. FIG. 3 is a structural view schematically showing a RRAM cell according to an embodiment of the present disclosure. As shown in FIG. 3, the memory cell may comprise a two-state resistor 11 and a resistive switching memory cell 12 connected in series. The two-state resistor 11 can have a bidirectional rectifying characteristic, and may comprise a lower conductive electrode 101, a two-state resistor functionality layer, and a middle conductive electrode 105. The resistive switching memory cell 12 can be unipolar or bipolar, and may comprise the middle conductive electrode 105, a resistive storage layer 106, and an upper conductive electrode 107.

It is to be noted that in the example shown in FIG. 3 the two-state resistor 11 and the resistive switching memory cell 12 share the middle conductive electrode 105. Certainly, the two-state resistor 11 and the resistive switching memory cell 12 may have respective electrodes instead of the shared middle conductive electrode 105. Further, in the example shown in FIG. 3, the two-state resistor is positioned underneath the resistive switching memory cell. However, the present disclosure is not limited to the relative position of the two-state resistor with respect to the resistive switching memory cell. Alternatively, the two-state resistor may be positioned above the resistive switching memory cell.

As shown in FIG. 3, the two-state resistor functionality layer may comprise an n-type semiconductor layer 102, a p-type semiconductor layer 103, and a further n-type semiconductor layer 104. Specifically, the two-state resistor functionality layer may comprise an n-p-n junction or a p-n-p junction consisted of, for example, any one or more of properly doped Si, Ge, GaAs, InP, and SiGe. Preferably, the two-state resistor functionality layer may comprise an n-p-n Si nanowire. The two-state resistor functionality layer can be achieved by deposition, such as Chemical Vapor Deposition, Atom Layer Deposition, and Molecule Beam Epitaxy. The n-p-n junction or the p-n-p junction can be doped by means of, e.g., thermal diffusion or ion implantation, with a doping concentration of about $1\times10^{12}$ cm$^{-2}$-about $1\times10^{22}$ cm$^{-2}$, preferably about $1\times10^{15}$ cm$^{-2}$-about $1\times10^{17}$ cm$^{-2}$. Generally, the two-state resistor may have a thickness of about 10 nm-about 500 nm, preferably about 50 nm-about 200 nm.

The RRAM cell shown in FIG. 3 may have its programming voltage, erasing voltage, and read voltage set based on current-voltage (I-V) characteristics of the two-state resistor 11 and the resistive switching memory cell 12, so as to suppress reading crosstalk. Specifically, these voltages can be set as follows.

Figure 4:
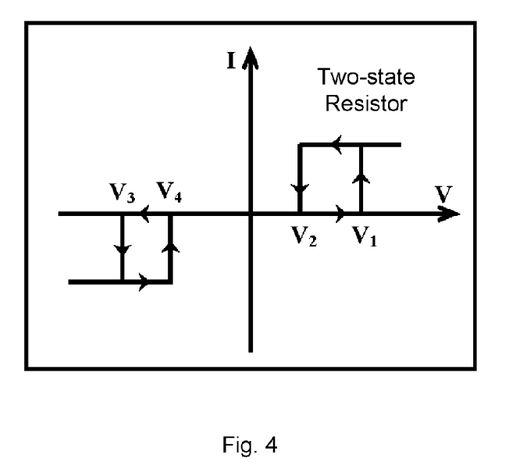
FIG. 4 is a plot showing an characteristic presented by a two-state resistor in a RRAM cell under a DC sweep according to an embodiment of the present disclosure.

FIG. 4 is a plot showing an I-V characteristic presented by a two-state resistor in a RRAM cell under a DC sweep according to an embodiment of the present disclosure. As shown in FIG. 4, the two-state resistor firstly assumes a high-resistance state, and turns ON when a forward sweeping voltage reaches a forward ON voltage $V_1$. Thus, the two-state resistor comes into a low-resistance state from the high-resistance state, and keeps this low-resistance state in a forward direction. When the sweeping voltage is swept back from $V_1$, the two-state resistor can keep the low-resistance state until the sweeping voltage becomes lower than $V_2$ ($V_1 > V_2$), at which point the two-state resistor comes back to the high-resistance state from the low-resistance state. The two-state resistor exhibits a similar electric characteristic under a reverse sweeping voltage. Specifically, the two-state resistor comes into the low-resistance state from the high-resistance state when the sweeping voltage is greater than a reverse ON voltage $V_3$, and keeps this low-resistance state in a reverse direction. When the sweeping voltage is swept back, the two-state resistor can keep the low-resistance state until the sweeping voltage becomes smaller than $V_4$ ($|V_3| > |V_4|$), at which point the two-state resistor resumes the high-resistance state. Here, the symbol "| |" means a mathematic absolution value. According to an embodiment, the forward ON voltage has an absolution value less than that of the reverse ON voltage, that is, $|V_1| < |V_3|$. The forward and reverse ON voltages are determined, at least partially, by the doping concentration or junction depth of the n-p-n or p-n-p junction of the two-state resistor functionality layer. For n-type doping, the ON voltage decreases with increasing of the n-type doping, and for p-type doping, the ON voltage increases with increasing of the p-type doping. For example, for a two-state resistor, generally $V_1$ lies between about 2V-about 3V, $V_2$ lies between about 1V-about 2V, $V_3$ lies between about 3V-about 4V, and $V_4$ lies between about 1V-about 3V.

Thus, the two-state resistor can assume two different resistance states at both intervals of $V_1$-$V_2$ and $V_3$-$V_4$. Also, as shown in FIG. 4, the two-state resistor keeps the low-resistance state in both regimes of the operation voltage $> V_1$ and the operation voltage $> V_3$, so that it can supply relatively large operation currents under both the positive and negative voltage polarities. Hereinafter, read/write settings of a RRAM cell comprising a unipolar resistive switching memory cell and a RRAM cell comprising a bipolar resistive switching memory cell will be described in detail, respectively.

Figure 5:
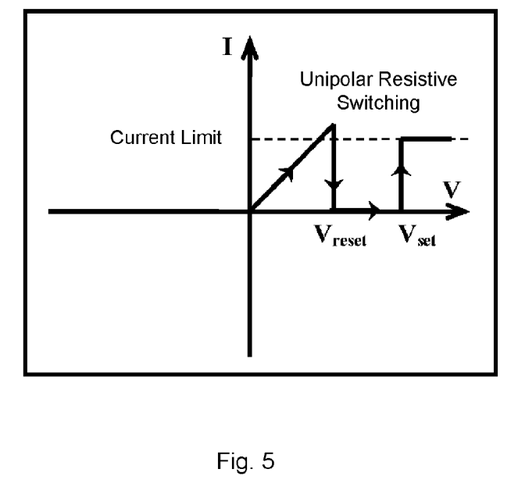
FIG. 5 is a plot showing an characteristic presented by a unipolar resistive switching memory cell in a RRAM cell under a DC sweep according to an embodiment of the present disclosure.

First, the RRAM cell comprising the unipolar resistive switching memory cell is described. FIG. 5 is a plot showing an I-V characteristic presented by a unipolar resistive switching memory cell in a RRAM cell under a DC sweep according to an embodiment of the present disclosure. As shown in FIG. 5, the unipolar resistive switching memory cell firstly assumes a high-resistance state, and is subjected to a forward scanning voltage with current limitation. The resistive switching memory cell comes into a low-resistance state from the high-resistance state when the sweeping voltage reaches $V_{set}$, and will keep this low-resistance state even if the applied voltage is removed. In an erasing operation, a forward scanning voltage, but without current limitation, is applied across the resistive switching memory cell. The resistive switching memory cell comes back to the high-resistance state when the sweeping voltage reaches $V_{reset}$, and will keep this high-resistance state even if the applied voltage is removed. A read voltage for the unipolar resistive switching memory cell can be set to satisfy a condition of $V_{read} < V_{reset} < V_{set}$. For example, for a unipolar resistive switching memory cell, generally $V_{set}$ lies between about 5V-about 8V, $V_{reset}$ lies between about 3V-about 5V, and $V_{read}$ is about 2.2V.

Figure 6:
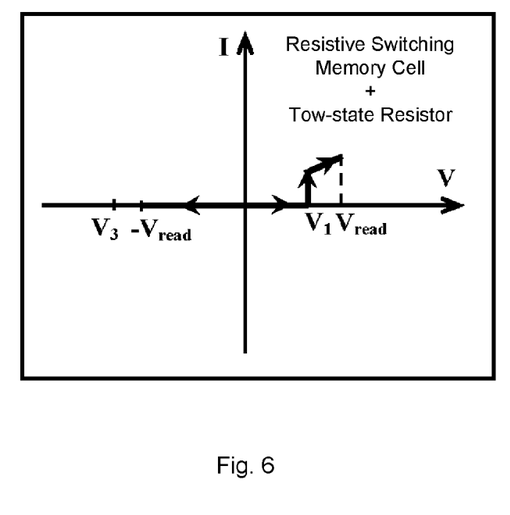
FIG. 6 is a schematic plot showing an characteristic presented by a RRAM cell in a low-resistance state during a read operation.

Read/write settings of a RRAM cell comprising a unipolar resistive switching memory cell and a two-state resistor connected in series can be made as follows. Initially both the unipolar resistive switching memory cell and the two-state resistor assume the high-resistance state. A programming voltage $V_{program}$ can be applied across the series connection to program the unipolar resistive switching memory cell into the low-resistance state when the programming voltage satisfies a condition of $V_{program} > V_{set} > V_1$. An erasing voltage $V_{erase}$ can be applied across the series connection to bring the unipolar resistive switching memory cell from the low-resistance state back into the high-resistance state when the erasing voltage satisfies a condition of $V_1 < V_{reset} < V_{erase} < V_{set}$. When the unipolar resistive switching memory cell is in the low-resistance state, a read voltage $V_{read}$ can be used to read the state of the device, and satisfies conditions of $V_1 < V_{read} < V_{reset}$ and $|V_{read}| < |V_3|$. FIG. 6 is a schematic plot showing an I-V characteristic presented by the RRAM cell in the low-resistance state during the read operation. As shown in FIG. 6, the RRAM cell exhibits the asymmetric I-V characteristic under the forward and reverse read voltages.

As described above, in a crossbar array of memory cells each comprising a unipolar resistive switching memory cell and a two-state resistor connected in series, leakage paths in the crossbar array can be reduced and thus reading crosstalk can be suppressed by appropriately setting the forward and reverse ON voltages of the two-state resistor and the read/write voltages of the unipolar resistive switching memory cell.

Figure 7:
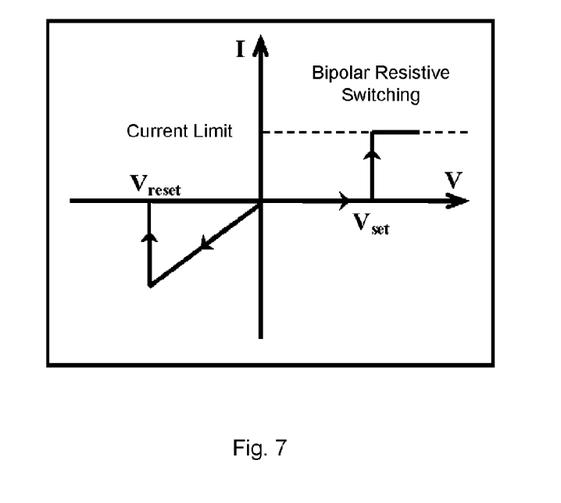
FIG. 7 is a plot showing an I-V characteristic presented by a bipolar resistive switching memory cell in a RRAM cell under a DC sweep according to an embodiment of the present disclosure.

Second, the RRAM cell comprising the bipolar resistive switching memory cell is described. FIG. 7 is a plot showing an I-V characteristic presented by a bipolar resistive switching memory cell in a RRAM cell under a DC scan according to an embodiment of the present disclosure. As shown in FIG. 7, the bipolar resistive switching memory cell firstly assumes a high-resistance state, and is subjected to a forward sweeping voltage with current limitation. The resistive switching memory cell comes into a low-resistance state from the high-resistance state when the sweeping voltage reaches $V_{set}$, and will keep this low-resistance state even if the applied voltage is removed. Unlike the unipolar resistive switching memory cell, an erasing operation of the bipolar resistive switching memory cell should be done in a reverse polarity. Specifically, a reverse sweeping voltage is applied across the device. The current flowing through the device will drop abruptly when the sweeping voltage reaches $V_{reset}$. At this point, the device comes back to the high-resistance state from the low-resistance state, and will keep this high-resistance state even if the applied voltage is removed. For example, for a bipolar resistive switching memory cell, generally $V_{set}$ lies between about 3V-about 5V, $V_{reset}$ lies between about −3V-about −5V, and $V_{read}$ is about 2.2V.

A two-state resistor exhibits a rectifying characteristic in both the forward direction and the reverse direction, and thus can serve as a selector device for a bipolar resistive switching memory cell, provided that the forward and reverse ON voltages of the two-state resistor and the read/write voltages of the bipolar resistive switching memory cell are set appropriately.

Read/write settings of a RRAM cell comprising a bipolar resistive switching memory cell and a two-state resistor connected in series can be made as follows. Initially both the bipolar resistive switching memory cell and the two-state resistor assume the high-resistance state. A programming voltage $V_{program}$ can be applied across the series connection to program the bipolar resistive switching memory cell into the low-resistance state when the programming voltage satisfies a condition of $V_{program} > V_{set} > V_1$. An erasing voltage $V_{erase}$ can be applied across the series connection to bring the bipolar resistive switching memory cell from the low-resistance state back into the high-resistance state when the erasing voltage satisfies a condition of $|V_{erase}| > V_3$. When the bipolar resistive switching memory cell is in the low-resistance state, a read voltage $V_{read}$ can be used to read the state of the device, and satisfies conditions of $V_1 < V_{read} < V_{set}$ and $|V_{read}| < |V_3|$. As shown in FIG. 6, the device exhibits the I-V characteristic with a rectifying profile under the forward and reverse read voltages.

As described above, in a crossbar array of memory cells each comprising a bipolar resistive switching memory cell and a two-state resistor connected in series, leakage paths in the crossbar array can be reduced and thus reading crosstalk can be suppressed by appropriately setting the forward and reverse ON voltages of the two-state resistor and the read/write voltages of the bipolar resistive switching memory cell.

According to an embodiment, the resistive storage layer may have a thickness of about 5 nm-about 500 nm, preferably about 50 nm-about 500 nm. The resistive storage layer may comprise any one or more of CuS, AgS, AgGeSe, (0.1<x<1), $ZrO_2$, $HfO_2$, $TiO_2$, $SiO_2$, $WO_x$ (1<x<3), NiO, $CuO_x$ (0.5<x<1), ZnO, $TaO_x$ (1<x<2.5), CoO, $Y_2O_3$, Si, PCMO (PrCaMnO), SZO ($SrZrO_3$), STO ($SrTiO_3$), and organic materials, with or without being doped. The organic materials may comprise Cu-TCNQ (Cu-tetracy anoquinodimethane), AlQ3 (aluminium tris(quinolin-8-olate)), or PEDOT (poly(3, 4-ethylenedioxythiophene)). The resistive storage layer may be formed by means of deposition, such as Electron Beam Evaporation, Chemical Vapor Deposition, Pulsed Laser Deposition, Atom Layer Deposition, Spin Coating, and Magnetron Sputtering.

According to an embodiment, each of the upper, middle and lower conductive electrodes may have a thickness of about 1 nm-500 nm, preferably about 20 nm-about 100 nm. Each of the electrodes may comprise any one or more of W, Al, Cu, Au, Ag, Pt, Ru, Ti, Ta, Pb, Co, Mo, Ir, Ni, TiN, TaN, $IrO_2$, ITO, and IZO. The electrodes may be deposited by means of any one of Electron Beam Evaporation, Chemical Vapor Deposition, Pulsed Laser Deposition, Atom Layer Deposition, and Magnetron Sputtering.

Figure 8:
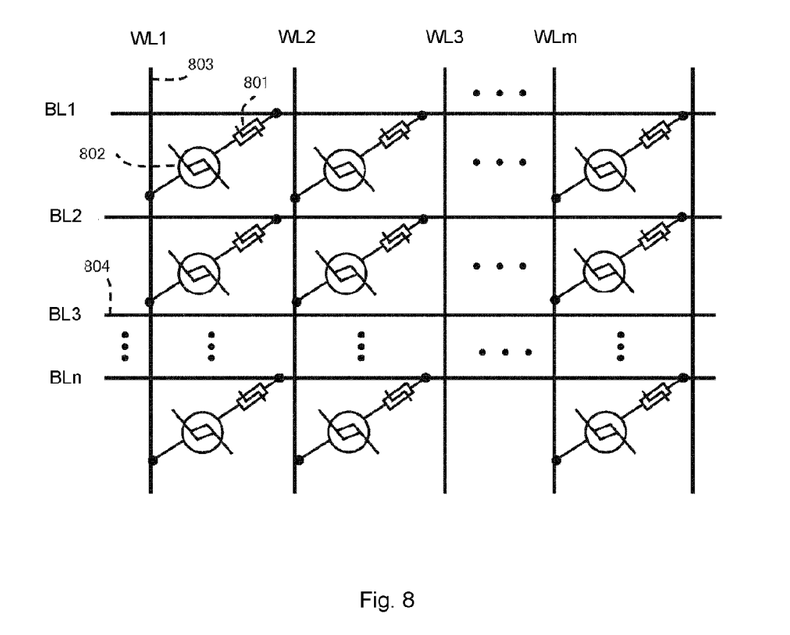
FIG. 8 is a structural view schematically showing a RRAM according to an embodiment of the present disclosure.

According to a further embodiment, there is provided a RRAM with a matrix configuration of RRAM cells, where tow-state resistors serve as selector devices. FIG. 8 is a structural view schematically showing a RRAM according to an embodiment of the present disclosure. As shown in FIG. 8, the RRAM comprises a plurality of above described RRAM cells, an addressing unit (not shown) and a resistance read/write unit (not shown). the addressing unit may comprise n bit lines (804) and m word lines (803). The bit lines and word lines can be connected to a peripheral decoder circuitry, so as to address a RRAM cell and to perform programming, erasing, and read operations thereon. The RRAM cells are disposed at intersections between the bit lines and the word lines. Each of the RRAM cells comprises a two-state resistor (801) and a resistive switching memory cell (802).

According to a further embodiment, a memory cell comprises a resistive switching memory cell and a two-state resistor. The two-state resistor may comprise a lower conductive electrode, a two-state resistor functionality layer, and a middle conductive electrode. The resistive switching memory cell may comprise the middle conductive electrode, a resistive storage layer, and an upper conductive electrode. In this example, the two-state resistor and the resistive switching memory cell share the middle conductive electrode.

In a memory cell according to an example of the present disclosure, the two-state resistor functionality layer comprises an n-p-n junction consisted of doped Si, with a doping concentration of about $1 \times 10^{12}$ $cm^{-2}$, and has a thickness of about 10 nm. The resistive storage layer comprises CuS with a thickness of about 5 nm. The upper, middle and lower electrodes each can comprise Au with a thickness of about 1 nm.

In a memory cell according to a further example of the present disclosure, the two-state resistor functionality layer comprises a p-n-p junction consisted of doped GaAs, with a doping concentration of about $1 \times 10^{17}$ $cm^{-2}$, and has a thickness of about 100 nm. The resistive storage layer comprises AgGeSe with a thickness of about 50 nm. The upper, middle and lower electrodes each can comprise Ag with a thickness of about 10 nm.

In a memory cell according to a still further example of the present disclosure, the two-state resistor functionality layer comprises an n-p-n junction consisted of doped SiGe, with a doping concentration of about $1 \times 10^{19}$ $cm^{-2}$, and has a thickness of about 200 nm. The resistive storage layer comprises PCMO with a thickness of about 100 nm. The upper, middle and lower electrodes each can comprise Au with a thickness of about 50 nm.

In a memory cell according to a still further example of the present disclosure, the two-state resistor functionality layer comprises a p-n-p junction consisted of doped InP, with a doping concentration of about $1 \times 10^{22}$ $cm^{-2}$, and has a thickness of about 500 nm. The resistive storage layer comprises $WO_2$ with a thickness of about 500 nm. The upper, middle and lower electrodes each can comprise Al with a thickness of about 500 nm.

Experiments show that the memory cells according to the four examples as described above satisfy design requirements, resulting in reduced leakage paths and suppressed reading crosstalk in a matrix configuration.

As described above, the two-state resistor exhibits the rectifying characteristic under both positive and negative voltage polarities, and can supply a relatively operation current if the applied voltage exceeds the ON voltage in both the forward and reverse directions. Therefore, a two-state resistor can serve as a selector device for a unipolar resistive switching memory cell or a bipolar resistive switching memory cell. In a crossbar array of memory cells with such two-state resistors, misread and crosstalk can be suppressed.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A Resistive Random Access Memory (RRAM) cell comprising a two-state resistor and a resistive switching memory cell connected in series,
   wherein the two-state resistor comprises a lower conductive electrode, a two-state resistor functionality layer, and a middle conductive electrode, and
   wherein the two-state resistor functionality layer comprises an n-p-n junction or a p-n-p junction consisted of any one or more of doped Si, Ge, GaAs, InP, and SiGe, wherein the two-state resistor is configured so that:
   the two-state resistor comes into a low-resistance state from a high-resistance state when a forward sweeping voltage reaches a forward ON voltage $V_1$, and keeps this low-resistance state in a forward direction,
   when the sweeping voltage is swept back from $V_1$, the two-state resistor keeps the low-resistance state until the sweeping voltage becomes lower than $V_2$, at which point the two-state resistor comes back to the high-resistance state from the low-resistance state, wherein $V_1 > V_2$,
   the two-state resistor comes into the low-resistance state from the high-resistance state when a reverse sweeping voltage reaches a reverse ON voltage $V_3$, and keeps the low-resistance state in a reverse direction, and
   when the sweeping voltage is swept back from $V_3$, the two-state resistor keeps the low-resistance state until the sweeping voltage becomes smaller than $V_4$, at which point the two-state resistor comes back to the high-resistance state from the low-resistance state, wherein $|V_3| > |V_4|$.

2. The RRAM cell according to claim 1, wherein in the two-state resistor functionality layer, the n-p-n junction or the p-n-p junction has a doping concentration of about $1\times10^{12}$ cm$^{-2}$-about $1\times10^{22}$ cm$^{-2}$.

3. The RRAM cell according to claim 2, wherein the n-p-n junction comprises an n-p-n Si nanowire.

4. The RRAM cell according to of claim 3, wherein the resistive switching memory cell comprises the middle conductive electrode, a resistive storage layer, and an upper conductive electrode, wherein the two-state resistor and the resistive switching memory cell share the middle conductive electrode.

5. The RRAM cell according to of claim 2, wherein the resistive switching memory cell comprises the middle conductive electrode, a resistive storage layer, and an upper conductive electrode, wherein the two-state resistor and the resistive switching memory cell share the middle conductive electrode.

6. The RRAM cell according to claim 1, wherein the two-state resistor functionality layer has a thickness of about 10 nm-about 500 nm, is doped by means of thermal diffusion or ion implantation, and is deposited by means of Chemical Vapor Deposition, Atom Layer Deposition, or Molecule Beam Epitaxy.

7. The RRAM cell according to of claim 6, wherein the resistive switching memory cell comprises the middle conductive electrode, a resistive storage layer, and an upper conductive electrode, wherein the two-state resistor and the resistive switching memory cell share the middle conductive electrode.

8. The RRAM cell according to claim 1, wherein the resistive switching memory cell comprises a bipolar resistive switching memory cell, and has:
   a programming voltage $V_{program}$ satisfying $V_{program} > V_{set} > V_1$;
   an erasing voltage $V_{erase}$ satisfying $|V_{erase}| > V_3$; and
   a read voltage $V_{read}$ satisfying $V_1 < V_{read} < V_{set}$ and $|V_{read}| < |V_3|$,
   wherein $V_{set}$ is a threshold at which the bipolar resistive switching memory cell transits from a high-resistance state to a low-resistance state.

9. The RRAM cell according to of claim 8, wherein the resistive switching memory cell comprises the middle conductive electrode, a resistive storage layer, and an upper conductive electrode, wherein the two-state resistor and the resistive switching memory cell share the middle conductive electrode.

10. The RRAM cell according to claim 1, wherein the resistive switching memory cell comprises an unipolar resistive switching memory cell, and has:
    a programming voltage $V_{program}$ satisfying $V_{program} > V_{set} > V_1$;
    an erasing voltage $V_{erase}$ satisfying $V_1 < V_{reset} < V_{erase} < V_{set}$; and
    a read voltage $V_{read}$ satisfying $V_1 < V_{read} < V_{reset}$ and $|V_{read}| < |V_3|$,
    wherein $V_{set}$ is a threshold at which the unipolar resistive switching memory cell transits from a high-resistance state to a low-resistance state, and $V_{reset}$ is a threshold at which the unipolar resistive switching memory cell transits from the low-resistance state to the high-resistance state.
    wherein $V_{set}$ is a threshold at which the unipolar resistive switching memory cell transits from a high-resistance state to a low-resistance state, and $V_{reset}$ is a threshold at which the unipolar resistive switching memory cell transits from the low-resistance state to the high-resistance state.

11. The RRAM cell according to of claim 10, wherein the resistive switching memory cell comprises the middle conductive electrode, a resistive storage layer, and an upper conductive electrode, wherein the two-state resistor and the resistive switching memory cell share the middle conductive electrode.

12. The RRAM cell according to claim 1, wherein the resistive switching memory cell comprises the middle conductive electrode, a resistive storage layer, and an upper conductive electrode, wherein the two-state resistor and the resistive switching memory cell share the middle conductive electrode.

13. The RRAM cell according to claim 12, wherein the resistive storage layer has a thickness of about 5 nm-about 500 nm, is deposited by means of any one of Electron Beam Evaporation, Chemical Vapor Deposition, Pulsed Laser Deposition, Atom Layer Deposition, Spin Coating, and Magnetron Sputtering, and comprises any one or more of CuS, AgS, AgGeSe, $CuI_xS_{l-x}$ where $0.1<x<1$, $ZrO_2$, $HfO_2$, $TiO_2$, $SiO_2$, $WO_x$ where $1<x<3$, NiO, $CuO_x$ where $0.5<x<1$, ZnO, $TaO_x$ where $1<x<2.5$, CoO, $Y_2O_3$, Si, PrCaMnO, $SrZrO_3$, $SrTiO_3$, Cu-tetracy anoquinodimethane (Cu-TCNQ), aluminium tris(quinolin-8-olate) ($AlQ_3$), and poly(3,4-ethylenedioxythiophene) (PEDOT), with or without being doped.

14. The RRAM cell according to claim 12, wherein each of the upper, middle and lower conductive electrodes has a thickness of about 1 nm-500 nm, is deposited by means of any one of Electron Beam Evaporation, Chemical Vapor Deposition, Pulsed Laser Deposition, Atom Layer Deposition, and Magnetron Sputtering, and comprises any one or more of W, Al, Cu, Au, Ag, Pt, Ru, Ti, Ta, Pb, Co, Mo, Ir, Ni, TiN, TaN, $IrO_2$, ITO, and IZO.

15. A Resistive Random Access Memory (RRAM) comprising a resistance read/write unit, an addressing unit, and a plurality of RRAM cells according to claim 1,
- wherein the addressing unit is connected to the plurality of RRAM cells, and is configured to address a RRAM cell to be operated, wherein operation on the RRAM cell comprises setting, resetting, and programming, and
- wherein the resistance read/write unit is connected to the addressing unit and to the plurality of RRAM cells, and is configured to operate the addressed RRAM cell.

* * * * *